US 6,337,151 B1

(12) United States Patent
Uzoh et al.

(10) Patent No.: US 6,337,151 B1
(45) Date of Patent: Jan. 8, 2002

(54) GRADED COMPOSITION DIFFUSION BARRIERS FOR CHIP WIRING APPLICATIONS

(75) Inventors: Cyprian E. Uzoh, Milpitas, CA (US); Daniel C. Edelstein, New Rochelle; Andrew H. Simon, Fishkill, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/377,330

(22) Filed: Aug. 18, 1999

(51) Int. Cl.[7] .............................. H01L 23/00; B32B 9/00
(52) U.S. Cl. ....................... 428/698; 428/428; 428/450; 428/472; 428/452; 257/485; 257/486; 257/751; 257/915
(58) Field of Search ................................. 428/428, 432, 428/450, 472, 698, 212, 209; 257/751, 485, 486, 915

(56) References Cited

U.S. PATENT DOCUMENTS

| | | | |
|---|---|---|---|
| 3,877,063 A | | 4/1975 | Abraham et al. |
| 4,447,825 A | | 5/1984 | Oana et al. |
| 4,702,967 A | | 10/1987 | Black et al. |
| 4,784,973 A | | 11/1988 | Stevens et al. |
| 4,976,839 A | | 12/1990 | Inoue |
| 5,286,676 A | | 2/1994 | Kruger et al. |
| 5,329,153 A | * | 7/1994 | Dixit ............................ 257/530 |
| 5,330,853 A | | 7/1994 | Hofmann et al. |
| 5,491,365 A | | 2/1996 | Chin et al. |
| 5,561,326 A | * | 10/1996 | Ito et al. ...................... 257/751 |
| 5,670,823 A | | 9/1997 | Kruger et al. |
| 5,699,291 A | | 12/1997 | Tsunemine |
| 5,747,361 A | * | 5/1998 | Ouellet ......................... 437/190 |
| 5,747,879 A | | 5/1998 | Rastogi et al. |
| 6,028,033 A | * | 2/2000 | Frisa et al. ................... 438/653 |
| 6,091,148 A | * | 7/2000 | Givens et al. ............... 257/750 |
| 6,174,799 B1 | * | 1/2001 | Lopatin et al. .............. 438/267 |

FOREIGN PATENT DOCUMENTS

EP 0551117 A2 * 7/1993

OTHER PUBLICATIONS

Ting, C.Y. "TiN formed by evaporation as a diffusion barriere later between Al and Si", J. Vac. Sci. 21(1), May-?Jun. 1982, pp. 14–18.*

* cited by examiner

Primary Examiner—Deborah Jones
Assistant Examiner—Stephen Stein
(74) Attorney, Agent, or Firm—Connolly Bove Lodge & Hutz; Joseph P. Abate

(57) ABSTRACT

A barrier film for a semiconductor device structure. The barrier film includes a compound including nitrogen and at least one of titanium or tantalum, nitrogen in a concentration that varies within the barrier film, and oxygen in a concentration that varies within the barrier film.

27 Claims, 1 Drawing Sheet

GRADED COMPOSITION DIFFUSION BARRIERS FOR CHIP WIRING APPLICATIONS

FIELD OF THE INVENTION

The invention relates to semiconductor devices. In particular, the present invention relates to a process for plating a conductive material to a conductive feature in or on a substrate. More particularly, the present invention concerns electroplating metal to fill submicron structures formed in a substrate. The present invention also relates to the metal filled submicron structures.

BACKGROUND OF THE INVENTION

In the production of microelectronic devices, metal may be plated in and on semiconductor structures for a variety of purposes. The metal may be deposited to form vias and/or conductive lines, such as wiring structures. Typically, metal is plated in cells or reservoirs that hold a plating solution that includes at least one metal and/or alloy to be plated on the substrate.

SUMMARY OF THE INVENTION

The invention provides a barrier film for a semiconductor device structure. The barrier film includes a compound including nitrogen and at least one of titanium or tantalum. The barrier film also includes nitrogen in a concentration that varies within the barrier film and oxygen in a concentration that varies within the barrier film.

The present invention also provides a semiconductor device structure including a region of electrically insulating material, a region of electrically conducting material, and a barrier film between the region of electrically insulating material in the region of electrically conducting material. The barrier film includes a compound including nitrogen and at least one of titanium or tantalum, nitrogen in the concentration that varies within the barrier film, and oxygen in the concentration that varies within the barrier film.

The present invention also provides a method for forming a semiconductor device structure. The method includes depositing a barrier film on a region of electrically insulating material. The barrier film includes a compound including nitrogen at least one of titanium or tantalum, nitrogen in a concentration that varies within the barrier film, and oxygen in a concentration that varies within the barrier film. An electrically conducting material is deposited on at least a portion of the barrier film.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

Figure 1:
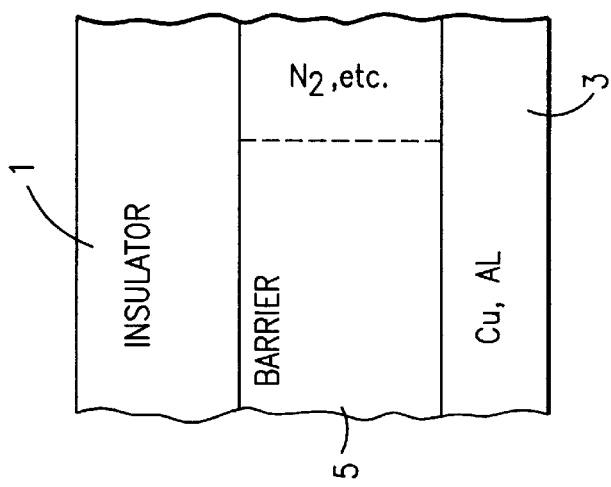
FIG. 1 represents a cross-sectional view of a known semiconductor device structure.

In semiconductor device structures, to prevent migration of metal from electrically conductive structures into surrounding materials a barrier structure may be created prior to forming the electrically conductive structures. For example, in chip wiring applications, to prevent migration of metal from wiring structures into surrounding materials, such as dielectric materials surrounding the wiring structures, a barrier may be deposited prior to depositing metal to form the electrically conductive structures. Barrier films are commonly deposited in damascene processes prior to depositing metal.

Typically, a barrier provides a barrier to migration of the metal and does not react with the conductive material or the surrounding material. Also, it is typically desirable that the barrier have low resistivity and good adhesion both to the conductive material and the surrounding material, such as dielectric material surrounding chip wiring structures. Other properties of the barrier are also important. As a result, in selecting a barrier film it may be necessary to balance adhesion, resistivity, contact resistance, and integration, among other characteristics.

Examples of two materials commonly utilized in barrier films are tantalum and titanium. Typically, neither titanium or tantalum in their pure form are a good barrier to copper or aluminum. However, compounds resulting from the reaction between tantalum or titanium and nitrogen tend to act as better diffusion barriers than pure titanium or pure tantalum.

In the case of tantalum, nitrides of tantalum exist not only in the form of materials with different stoichiometries, but also different allotropes. For example, they can be cubic tantalum nitride or hexagonal tantalum nitride. The characteristics of different isotopes and allotropes may differ. Along these lines, with tantalum nitrides, film adhesion to most substrates tends to increase with increasing nitrogen content. On the other hand, higher nitrogen content may increase film resistivity. However, as stated above, it is not desirable for the film to have a higher resistivity.

With respect to tantalum nitrides, the increase in film resistivity per unit increase in nitrogen content is not linear. For example, for cubic tantalum nitride with a nitrogen content above 36%, any marginal increase in nitrogen content may render the film resistive. In view of the above, in some cases, it may be necessary to make a choice between films with lower resistivity and marginal adhesion and films with excellent adhesion but very high comparative resistivities.

Certain barrier material illustrate the balance of properties among barrier materials. For example, nitrogen rich titanium nitride may be a good barrier to copper and aluminum. On the other hand, tantalum nitride poorly or marginally adheres to copper. According to another example, the resistivity of nitrogen rich titanium nitride and WNP may be greater than about 250 micro ohms ($\mu\Omega$) per centimeter. On the other hand, the resistivity of nitrogen rich tantalum nitride may be greater than 800 $\mu\Omega$/cm.

The present invention provides a solution to the above-described problems as well as others by providing a barrier film that optimizes barrier and electrical properties of the film. Typically, a barrier film according to the present invention includes a compound including nitrogen and at least one of titanium or tantalum. In other words, a barrier film according to the present invention includes titanium nitride(s) and/or tantalum nitride(s). The exact make up of the compounds may vary. In other words, the number of atoms of titanium and/or tantalum and nitrogen in the compound making up the barrier film may vary.

In addition to a nitrogen and titanium and/or tantalum containing compound, a barrier film according to the present invention also includes oxygen and/or nitrogen. The concentrations of nitrogen and oxygen in the barrier film vary within the barrier film. In other words, at certain locations in the barrier film, the nitrogen content will be higher than in other locations in the barrier film. At the same time, the concentration of oxygen at certain locations in the barrier film will greater than in other locations in the barrier film. Along these lines, it may be advantageous to have a greater nitrogen content in the vicinity of metal plated over the barrier film or in the vicinity of material underlying the barrier film. This results at least in part from the effects that oxygen and/or nitrogen can have on the barrier film materials, as described above.

By varying the nitrogen and/or oxygen contents of a barrier film, the properties of the film may be controlled to provide properties that are advantageous in different locations in the film. For example, in the vicinity of material underlying the barrier film, it may be desirable that the barrier film have better adhesion properties. The electrical properties of the barrier film may be less important in these regions. As a result, in the vicinity of the material underlying the barrier film, the composition may be such that it will tend to increase the adhesion of the barrier film to underlying material.

On the other hand, in the vicinity of metal deposited in a region overlying the barrier film, it may be desirable that the barrier film have improved electrical properties. Therefore, the composition in the vicinity of the overlying electrically conductive material, such as metal, may be varied for this purpose. This is particularly important to help ensure efficient electrical conductivity within an electrically conductive material overlying the barrier film. However, in the vicinity of the overlying metal, it may also be desirable that the barrier have properties tending to increase adhesion of the overlying metal.

As described above, the adhesion and electrical properties of a barrier film may be affected by controlling the concentrations of oxygen and/or nitrogen in the barrier material. The oxygen and/or nitrogen contents may also be optimized at various locations within the barrier film to stabilize the microstructure of the film and optimize the barrier properties of the film.

Along the lines of the above, regions of a barrier film in the vicinity of at least one metal or alloy overlying the barrier film, such as metal deposited over the barrier film for chip wiring applications, may have lower concentrations of nitrogen and/or oxygen as compared to other regions of the barrier film, such as regions in the vicinity of an underlying electrically insulating, or dielectric, material. The concentration of nitrogen in the barrier film in the vicinity of an underlying insulating material may be about 50% and about 50% tantalum, the percentages being atomic fractions, not weight. The percentages could be quantified by SIMS or Auger Electron Spectroscopy. On the other hand, in the vicinity of an overlying region of at least one metal and/or alloy, the nitrogen content of the barrier film may be about 20%.

On the other hand, the oxygen content of the barrier film may vary from about 0% in the vicinity of an underlying electrically insulating material to about 0.5% in the vicinity of an overlying metal and/or alloy.

As is evident from the above, the oxygen and/or nitrogen concentrations in the film would be highest in the vicinity of an underlying electrically insulating material and lowest in the vicinity of an overlying metal and/or alloy. In the event that the barrier film includes both oxygen and nitrogen, the concentration of oxygen would be highest where the concentration of nitrogen is highest. Conversely, the concentration of nitrogen may be highest where the oxygen concentration is highest.

Both the concentration of oxygen and the concentration of nitrogen may be highest in the vicinity of an underlying electrically insulating material. If the barrier film includes both oxygen and nitrogen, the concentration of oxygen may be lowest where the nitrogen content of the barrier film is lowest. Conversely, in the event that the barrier film includes both oxygen and nitrogen, the concentration of nitrogen in the barrier film may be lowest where the oxygen concentration is lowest.

The nitrogen in the barrier film may be in the form $N_2$, while the form of the oxygen in the barrier film may be $O_2$. The oxygen and nitrogen could also be in the form of elemental O and N. The elemental oxygen and nitrogen could be bound to Ta. In other words, the film could be TaN or TaO. Other forms could include $Ta_2N$ and $Ta_2O_5$. Other stoichiometries could also be determined by those skilled in the art without undue experimentation.

The barrier film may also include carbon. The concentration of carbon may vary within the barrier film to vary properties of the barrier film. Along these lines, the concentration of carbon may be lowest in the vicinity of an underlying electrically insulating material and highest in the vicinity of an overlying electrically conductive material. If the barrier film includes oxygen and/or nitrogen in addition to carbon, the concentrations of oxygen, nitrogen and/or nitrogen may all be lowest in the same region of the barrier film and all be highest in the same region of the barrier film.

The concentrations of oxygen, nitrogen and/or carbon in the barrier film may be varied for various reasons. In the vicinity of an overlying electrically conductive material, the oxygen, nitrogen and/or carbon content of the barrier film typically is sufficient to help ensure low resistivity of the film. Along these lines, at least in the vicinity of an overlying electrically conductive material, the resistivity of the barrier film may be at least about 250 $\mu\Omega$/cm. Alternatively, the resistivity of the barrier film in this region may be at least about 800 $\mu\Omega$ per centimeter.

The oxygen, nitrogen, and/or carbon content of the barrier film may also be varied such that the barrier film is an effective barrier to migration to at least one overlying metal and/or alloy. Typically, the oxygen and carbon doping would be less than about 1% to about 10%, the percentages being atomic percentages. On the other hand, the typical range for nitrogen content is about 30% to about 60%, again being expressed as atomic percent. The oxygen and carbon content typically is limited by an undesirable rise in resistivity of the barrier film. Typically, for a TaN film to provide a good barrier, the minimum resistivity would be about 200 $\mu\Omega$-cm. However, the barrier film could have a resistivity of up to about 1000 $\mu\Omega$-cm.

The rate that the oxygen, nitrogen and/or carbon content of the barrier film varies may vary. For example, the oxygen, nitrogen, and/or carbon content of the barrier film may vary at a constant rate throughout the barrier film from one value in the vicinity of an underlying electrically insulating region to another value in the vicinity of an overlying electrically conductive region. The constant rate could be linear or non-linear.

The oxygen, nitrogen, and/or carbon content of the barrier film may also vary at different rates throughout the barrier film. In other words, at one region in the barrier film, the oxygen, nitrogen, and/or carbon content may vary at one rate while at other locations within the barrier film the oxygen, nitrogen, and/or carbon content of the barrier film varies at a different rate or different rates. Rate variation could be constant in some portions of the barrier film and variable in other portions. The different rates could be linear and/or non-linear. Along these lines, the oxygen, nitrogen, and/or carbon content of the barrier film may vary at a linear fashion. In one portion of the barrier film and in the non-linear fashion or fashions in another region or regions of the barrier film.

The content of nitrogen, oxygen, and/or carbon in the barrier film may be varied in a controlled manner. The composition of the overlying electrically conducting material and/or the barrier film may be controlled to properly mate the electrically conducting material to the barrier film and help ensure adhesion of the barrier film and favorable electrical properties of the barrier film.

The present invention also includes a semiconductor device structure including a region of electrically insulating material, a region of electrically conducting material, and a barrier film between the region of electrically insulating material and the region of electrically conducting material wherein the barrier film is substantially as described above. Therefore, the content of the barrier film, the electrically conducting material, and the electrically insulating material may have compositions and characteristics as described above. The electrically insulating material may be any suitable electrically insulating material. Examples of electrically insulating material that may be utilized according to the present invention include silicon dioxide, silicon nitride, diamond-like carbon, carbon-doped silicate glass, fluorosilicate glass, SiO in various bulk, porous, and/or low dielectric constant forms, aerogels, FSG, FOX, SiLK, SiCOH, and organic polymers, such as polyimides, silsesquioxanes, poly-arylene ethers, fluoropolymers, among others. The barrier film may include at least one of tantalum nitride, titanium nitride and WNP as well as oxygen, nitrogen, and/or carbon in concentrations as described above.

The present invention also includes a method for forming a semiconductor device structure. The method includes depositing a barrier film on a region of electrically insulating material. The barrier film is substantially as described above. An electrically conducting material is then deposited on at least a portion of the barrier film. Depositing the barrier film may include depositing the compound including nitrogen and at least one of titanium and tantalum and then exposing the compound to $O_2$ gas and/or $N_2$ gas.

Carbon may be introduced into the barrier film alone, or simultaneously with the oxygen and/or nitrogen. Perhaps the most straightforward manner to introduce carbon into the film would be by cosputtering, where the desired amount of carbon is incorporated into the tantalum or titanium sputtering target. Alternatively, if oxygen is also desired, then oxygen and carbon can be introduced by reactive sputtering with a small partial pressure, for example, about 1e-6 torr, of $CO_2$, CO, or CN gas in conjunction with the typically used Ar and $N_2$ gases. Hydrocarbon or fluorocarbon gases, such as methane or $CF_4$ would not be as desirable, as the hydrogen or fluorine could possibly lead to embrittlement, swelling, etching, and possibly delamination of the desired barrier film. As discussed above, the typical range for C and O would be about 0% to about 10%, the percentages again being atomic percentages.

The adhesion of such materials can be expressed in terms of peel strengths. Typically, it is desired that the peel strengths be greater than about 1000 joules/$m^2$ at all interfaces. If possible, it is desirable for the peel strengths to be greater than about 400 to about 500 joules/m2.

Some other important properties of the barrier film include resistivity of about a few 100 $\mu\Omega$-cm or less; very high, or refractory, melting point so as to handle excess joule heating in presence of interconnect defects; proper selectivity and removal rates for etching or chemical mechanical polishing (CMP, in presence of the insulator and the interconnect main metal such as copper); no detrimental electrochemical or galvanic coupling to the copper interconnect that could lead to corrosion during CMP; no alloying or poisoning of the Cu interconnect after thermal cycling; low contact resistance, for example, less than about 2e-9 $\Omega$-$cm^2$, to underlying interconnects; good thermo-mechanical stability, for example, no cracking to typical temperatures exceeding about 400° C.; and good step coverage, such that a continuous layer may be deposited within deep and narrow, or high aspect ratio, vias and interconnect trenches.

The barrier film can be formed according to a variety of process. Typical processes for barrier film formation can include reactive sputtering or ionized reactive sputtering (PVD, I-PVD, physical vapor deposition) from a pure or C-doped Ta or Ti target, using Ar, $N_2$, and possibly $O_2$, $CO_2$, or CO gases in the partial pressure range mentioned above. These are possible using conventional, commercially available DC-magnetron or RF-ionized DC magnetron sputtering systems. In these systems, gas species, individual gas flow rates, DC and RF power, and substrate temperature may typically all be varied to find the best conditions for deposition.

FIG. 1 represents a cross-sectional view of a known semiconductor device structure. The structure illustrated in FIG. 1 includes a layer of electrically insulating material 1, a layer of electrically conducting material 3 and a barrier film 5 there between. The barrier film may include nitrogen, or other materials at constant levels throughout.

Figure 2:
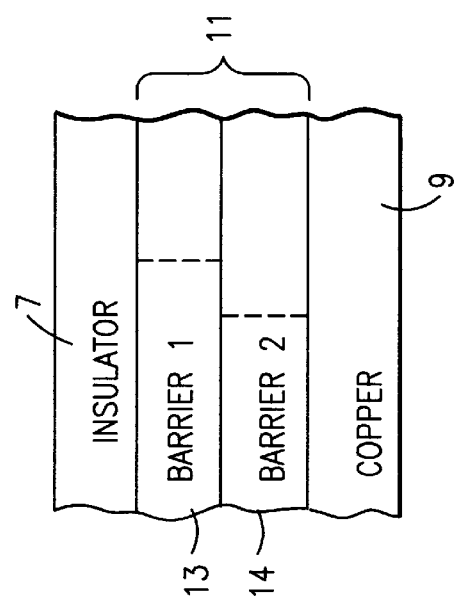
FIG. 2 represents a cross-sectional view of another embodiment of a known semiconductor device structure.

FIG. 2 represents a cross-sectional view of another embodiment of a known semiconductor device structure. The structure illustrated in FIG. 2 includes a layer of an electrically insulating material 7, a layer of electrically conducting material 9 and a barrier film 11 therebetween. The barrier film 11 includes two portions, a first portion 13 and a second portion 15. The composition of the two barrier films may be different to provide different properties in the vicinity of the electrically insulating material and the vicinity of the electrically conducting material.

Figure 3:
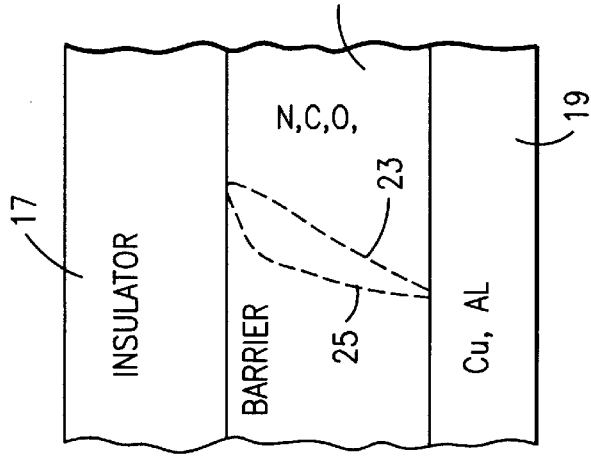
FIG. 3 represents a cross-sectional view of an embodiment of a semiconductor device structure according to the present invention.

FIG. 3 represents a cross-sectional view of an embodiment of a semiconductor device structure according to the present invention. The structure illustrated in FIG. 3 includes a layer of electrically insulating material 17 and a layer of electrically conducting material 19, and a barrier film 21 therebetween. As illustrated by layer 23 and 25, the content of nitrogen, carbon and oxygen in the barrier film may vary within the barrier film. Unlike the structure illustrated in FIG. 2 which includes two uniform regions in the barrier film, the contents of carbon, oxygen, and/or nitrogen in the barrier film may vary throughout the entire barrier film as in the embodiment illustrated in FIG. 3.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A semiconductor device structure, comprising:
   a region of electrically insulating material;
   a region of electrically conducting material; and
   a barrier film between the region of electrically insulating material and the region of electrically conducting material, the barrier film comprising a compound including nitrogen and at least one of titanium or tantalum, nitrogen in a concentration that varies within the barrier film, and oxygen in a concentration that varies within the barrier film;
   wherein the nitrogen content of the barrier film varies from about 30% to about 60% in atomic percent in the vicinity of the region of insulating material to about 0% in the vicinity of the region of an electrically conducting material; and
   wherein the oxygen content of the barrier film varies from about 1% to about 5% in the vicinity of the region of insulating material to about 0% in atomic percent in the vicinity of the region of electrically conducting material.

2. The semiconductor device structure according to claim wherein the nitrogen is in the form of at least one of $N_2$ or N.

3. The semiconductor device structure according to claim 1, wherein the oxygen is the form of at least one of $O_2$ or O.

4. The semiconductor device structure according to claim 1, wherein the barrier film further comprises carbon, wherein the concentration of carbon in the barrier film varies within the barrier film.

5. The semiconductor device structure according to claim 4, wherein a region of the barrier film in the vicinity of the electrically conducting material has a lower concentration of carbon as compared to other regions of the barrier film.

6. The semiconductor device structure according to claim 4, wherein the concentration of carbon in the barrier film is varied to increase adhesion of the barrier to the electrically insulating material and the electrically conducting material.

7. The semiconductor device structure according to claim 1, wherein the oxygen content of the barrier film varies from about 0% in atomic percent in the vicinity of the electrically insulating material to about 1% to about 5% in the vicinity of the electrically conducting material.

8. The semiconductor device structure according to claim 1, wherein the oxygen content and the nitrogen content of the barrier film are sufficient to help ensure low resistivity of the film in the vicinity of the electrically conducting material.

9. The semiconductor device structure according to claim 1, wherein the oxygen content and the nitrogen content of the barrier film are sufficient to help ensure that the film is an effective barrier to the electrically conducting material.

10. The semiconductor device structure according to claim 1, wherein the barrier film has a resistivity of about at least 250 $\mu\Omega$-cm.

11. The semiconductor device structure according to claim 1, wherein the barrier film has a resistivity of about at least 800 $\mu\Omega$-cm.

12. The semiconductor device structure according to claim 1, wherein the nitrogen content of the barrier film varies at a constant rate throughout the barrier film.

13. The semiconductor device structure according to claim 1, wherein the oxygen content of the barrier film varies at a constant rate throughout the barrier film.

14. The semiconductor device structure according to claim 1, wherein the nitrogen content of the barrier film varies at different rates throughout the barrier film.

15. The semiconductor device structure according to claim 1, wherein the oxygen content of the barrier film varies at different rates throughout the barrier film.

16. The semiconductor device structure according to claim 4, wherein the carbon content of the barrier film is lowest in the vicinity of a region having the lowest nitrogen content of the barrier film.

17. The semiconductor device structure according to claim 4, wherein the carbon content of the barrier film is lowest in the vicinity of a region having the lowest oxygen content of the barrier film.

18. The semiconductor device structure according to claim 4, wherein the carbon content of the barrier film is sufficient to help ensure low resistivity of the film in the vicinity of the electrically conducting material.

19. The semiconductor device structure according to claim 4, wherein the carbon content of the barrier film is sufficient to help ensure that the film is an effective barrier to the electrically conducting material.

20. The semiconductor device structure according to claim 4, wherein the carbon content of the barrier film varies at a constant rate throughout the barrier film.

21. The semiconductor device structure according to claim 4, wherein the carbon content of the barrier film varies at different rates throughout the barrier film.

22. The semiconductor device structure according to claim 1, wherein the electrically insulating material comprises at least one material selected from the group consisting of silicon dioxide, silicon nitride, diamond-like carbon, carbon-doped silicate glass, fluorosilicate glass, bulk SiO, porous SiO, low dielectric constant SiO, aerogels, FSG, FOX, SiLK, SiCOH, organic polymers, polyimides, silsesquioxanes, poly-arylene ethers, and fluoropolymers.

23. The semiconductor device structure according to claim 1, wherein the electrically conducting material comprises copper or aluminum.

24. The semiconductor device structure according to claim wherein the barrier film comprises at least one of TaN, TiN, or WNP.

25. The semiconductor device according to claim 1, wherein the carbon content of the barrier film varies from about 10% in atomic percent in the vicinity of the electrically insulating material to about 0% in the vicinity of the electrically conducting material.

26. The semiconductor device according to claim 1, wherein the barrier layer has a peel strength of about 1000 joules/m$^2$.

27. The semiconductor device according to claim 1, wherein the barrier layer has a peel strength of at least about 400 joules/m$^2$.

* * * * *